United States Patent [19]

LaPotin

[11] 4,447,747

[45] May 8, 1984

[54] WAVEFORM GENERATING APPARATUS

[75] Inventor: David P. LaPotin, Arlington, Mass.

[73] Assignee: GTE Laboratories Incorporated, Waltham, Mass.

[21] Appl. No.: 239,779

[22] Filed: Mar. 2, 1981

[51] Int. Cl.³ .................... H03K 13/11; H01L 27/04
[52] U.S. Cl. .................................. 307/529; 338/323; 338/325; 338/89; 357/20; 357/41; 357/51; 357/65; 340/347 DA
[58] Field of Search ............... 338/323, 325, 89, 200; 357/51, 20, 41; 307/529; 340/347 DA

[56] References Cited

U.S. PATENT DOCUMENTS

| | | | |
|---|---|---|---|
| 3,644,802 | 2/1972 | Dingwall | 357/51 |
| 3,666,995 | 5/1972 | Wensink et al. | 357/51 |
| 3,812,478 | 5/1974 | Tomisawa et al. | 357/51 |
| 4,181,878 | 1/1980 | Murai et al. | 357/20 |
| 4,295,098 | 10/1981 | Crowley | 328/14 |

OTHER PUBLICATIONS

Hamdé, IEEE J. Solid State Circuits, vol. SC13, No. 6, Dec. 1978, pp. 785–791.
Huang, IEEE J. Solid State Circuits, vol. SC15, No. 6, Dec. 1980; pp. 1084–1087.

*Primary Examiner*—William D. Larkins
*Attorney, Agent, or Firm*—David M. Keay

[57] ABSTRACT

Waveform generating apparatus for synthesizing a nonlinear waveform by sampling voltage levels along a series string of resistances. The series string of resistances is a linear resistance fabricated in a monolithic integrated circuit structure and includes a series of contiguous resistance elements of approximately the same physical configuration and of approximately equal resistance value. Each resistance element has a projection or nub. Particular ones of the nubs serve as source regions for MOS switching transistors at the sampling point. The intervening nubs are unconnected. The symmetry of the structure compensates for errors otherwise introduced by the presence of source region nubs at sampling points spaced in a non-linear relationship.

6 Claims, 6 Drawing Figures

WAVEFORM GENERATING APPARATUS

BACKGROUND OF THE INVENTION

This invention relates to apparatus for generating electrical waveforms. More particularly, it is concerned with apparatus for successively and repeatedly sampling a plurality of predetermined voltage levels to synthesize an analog waveform.

Analog voltage waveforms may be synthesized by sampling voltage levels which are produced at voltage nodes along a series string of resistances of predetermined values. The precision of the waveforms produced depends upon the precision of the voltage level at each node which, in turn, is determined by the precision of the resistance values between nodes along the series of resistances. Precise resistance values may be obtained with certain technologies. For example, with thin film technology techniques resistance elements can be trimmed by lasers to provide precise values.

In the fabrication of monolithic integrated circuits, specifically of the MOS type, however, it is difficult to obtain precise resistance values between nodes, as when the relationships are non-linear, for example. Typically, in MOS technology a series string of resistances is formed as a linear diffused region having taps at selected points along its length. Because of the size of the element and the physical constraints imposed by the processes employed, the taps require too much space to be considered as making contacts at points. That is, the taps themselves have an effect on the values of resistance between taps and thus on the precision of the voltage levels established at the voltage nodes.

SUMMARY OF THE INVENTION

The inherent advantages of monolithic integrated circuitry together with improved precision in voltage levels obtainable from a linear resistance are provided by monolithic integrated circuit structures in accordance with the present invention.

The structure comprises a body of semiconductor material having a region of one conductivity type (P or N) with a linear resistance of semiconductor material of the opposite conductivity type inset in the region. The linear resistance is a series of contiguous resistance elements of approximately the same configuration and of approximately equal resistance value. Each resistance element includes a projection of semiconductor material of the opposite conductivity type protruding into the region of the one conductivity type. A plurality of sectors of semiconductor material of the opposite conductivity type are inset in the region of the one conductivity type. The number of sectors is less than the number of resistance elements, and the sectors are adjacent to but spaced from projections of particular ones of the resistance elements. Each sector and the projection adjacent thereto form the drain and source regions, and the portion of the region of the one conductivity type between the drain and source regions forms the channel region of an MOS transistor. The MOS transistors at the particular selected ones of the resistance elements provide the taps for obtaining voltage levels from along the linear resistance.

In the figures the various parts of the semiconductor elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following discussion and appended claims in connection with the above-described drawings.

DETAILED DESCRIPTION OF THE INVENTION

Figure 1:
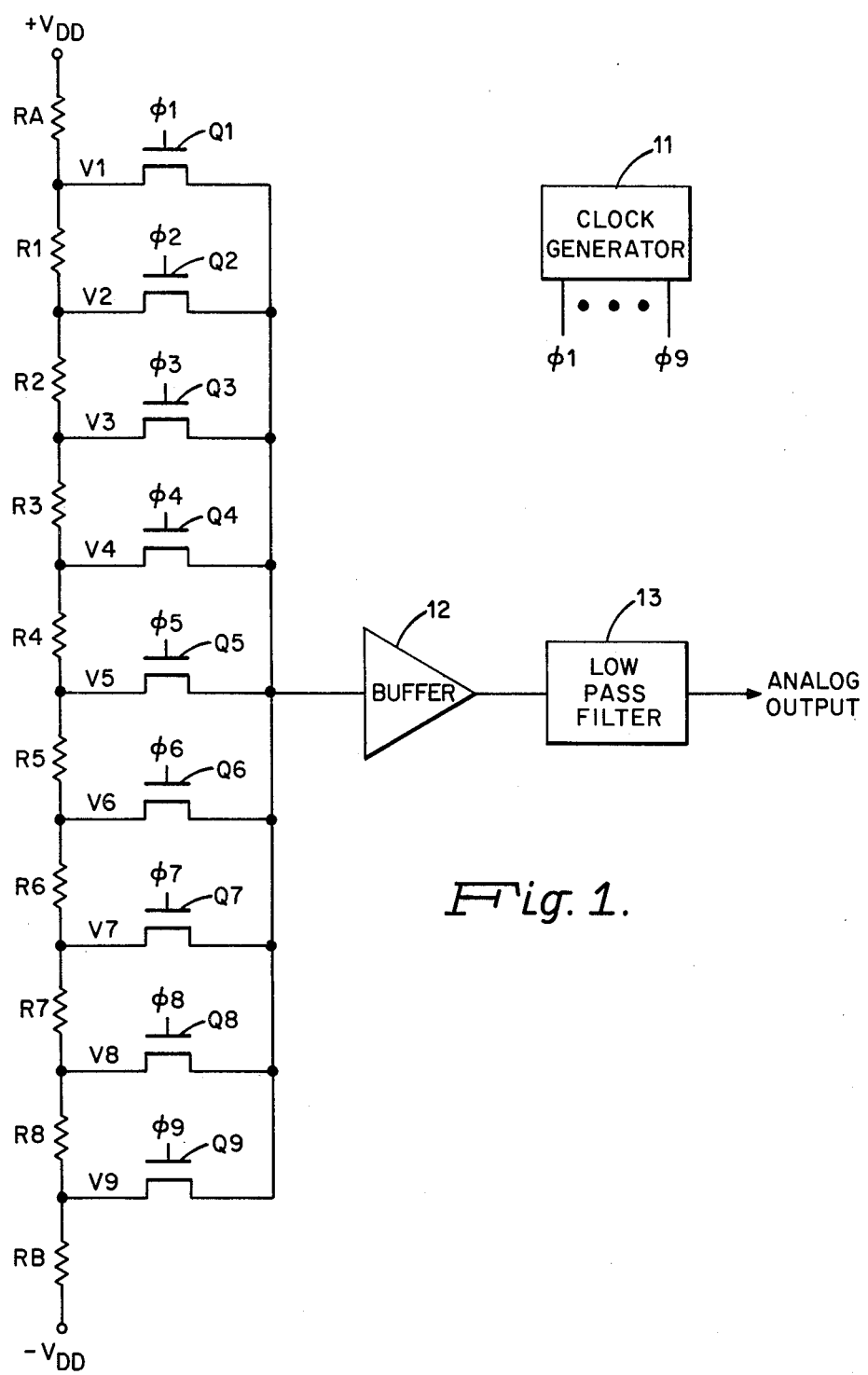
FIG. 1 is a circuit diagram of an analog voltage waveform generating apparatus employing a series string of resistances.
Figure 2:
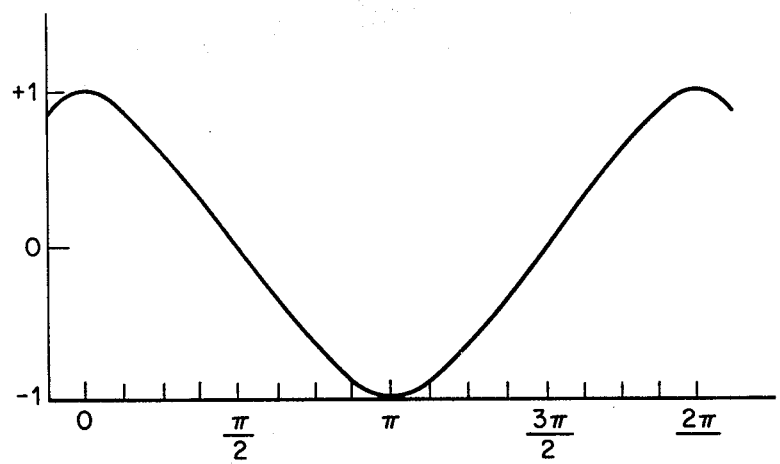
FIG. 2 illustrates a portion of a sine wave which may be generated by a specific embodiment of the apparatus of FIG. 1.

FIG. 1 is a schematic diagram of a waveform generator for synthesizing an analog voltage waveform, for example a sine wave as shown in FIG. 2. Each period of the sine wave is implemented in sixteen steps. A series string of eight resistances R1–R8 of appropriate value and biasing resistances RA and RB are connected end-to-end between two terminals for supplying operating voltages $+V_{DD}$ and $-V_{DD}$. The biasing resistances RA and RB are used to set the peak-to-peak amplitude and the DC level of the waveform. The resistances R1–R8 are selected such that the ratio between the resistance values derive a step approximation of the desired waveform.

The voltage nodes V1–V9 between each pair of resistances are sampled by operation of MOS transistor switches Q1–Q9 connected thereto. The MOS transistor switches Q1–Q9 are operated one at a time in appropriate sequence by clock pulses $\phi_1$–$\phi_9$ illustrated in FIG. 3 which are produced by a clock generator 11. The voltage level at the sampled node is applied to the input of a buffer 12. The buffer 12 has a very high input impedance so that no significant current flows on a steady state basis to the buffer input. Thus a constant current flows through the resistance string between voltage sources $+V_{DD}$ and $-V_{DD}$ assuring a predictable voltage drop across each resistance regardless of which MOS transistor Q1–Q9 is on. The output of the buffer 12 is passed through a low pass filter 13 to provide a smooth, continuous analog output waveform.

For producing a sine wave as shown in FIG. 2 having a normalized ±1 volt peak-to-peak amplitude the voltage levels at each node of the circuit of FIG. 1 are V1=1.0 volt, V2=0.9238795 volt, V3=0.7071068 volt, V4=0.3826834 volt, V5=0 volt, V6=−0.3826834 volt, V7=−0.7071058 volt, V8=−0.9238795 volt, and V9=−1.0 volt. The voltage drops across the resistances, assuming a normalized current of 1 ampere, therefore, are R1=R8=0.07612054 volt, R2=R7=0.216772 volt, R3=R6=0.3244234 volt, and R4=R5=0.3826834 volt. Normalizing the voltage drops across the resistances by dividing each by the drop across R1 provides the ratios between values of resistances; R1=R8=1, R2=R7=2.8477572, R3=R6=4.2619715, R4=R5=5.0273369.

Figure 4:
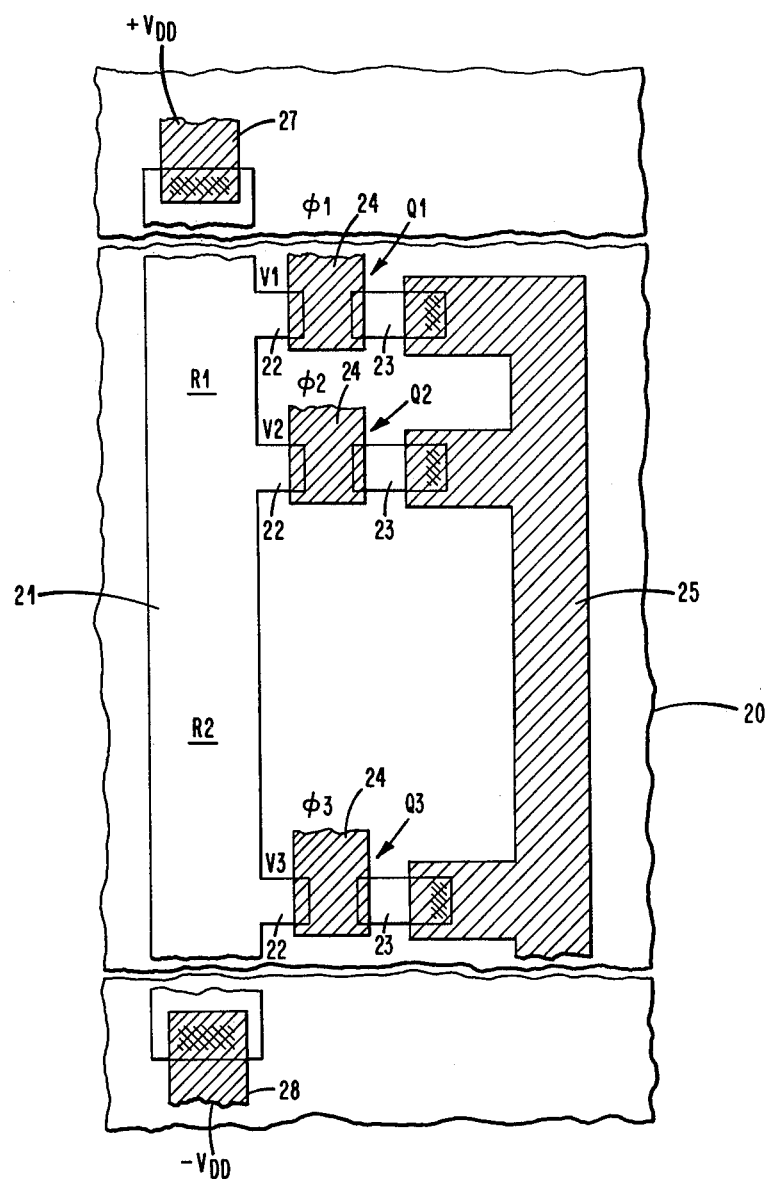
FIG. 4 is a representation of a fragment of MOS integrated circuit structure which may be used in the apparatus of FIG. 1.

FIG. 4 illustrates a portion of the apparatus of FIG. 1 fabricated as a monolithic integrated circuit in a body of semiconductor material. The fragment 20 of the body of semiconductor material may, for example, be P-type silicon prepared in a conventional well-known manner. Set within the silicon body is an elongated diffused region 21 of N-type conductivity forming a linear resistance 21. The linear resistance 21, only a portion of which is shown in FIG. 4, constitutes a series string of resistances R1–R8 and biasing resistances RA and RB. The ends of the linear resistance are connected to metal contacts 27 and 28 at openings in an adherent nonconductive coating of silicon oxide on the surface of the silicon body (as indicated by cross-hatching in FIG. 4) in order to provide connections to the voltage sources $+V_{DD}$ and $-V_{DD}$.

Taps to voltage nodes V1–V8 along the length of the linear resistance 21 are provided by extensions or nubs 22 of the same conductivity type, specifically N-type, as the linear resistance. Since, as noted above, the ratios of resistance values of the resistances R1–R8 differ in order to synthesize a sine wave, the spacings between nubs differ. Adjacent to but spaced from each of the nubs 22 is inset a diffused sector 23 also of N-type conductivity. The nub 22, the sector 23, and the portion of the P-type region between them constitute the source, drain, and channel region, respectively, of an enhancement type MOS transistor Q1–Q9. As is well-known, the channel region is covered by an overlying layer of an adherent nonconductive coating such as silicon oxide, and a conductive gate electrode 24 overlies the adherent coating over the channel. As indicated in FIG. 4 the gate electrodes 24 of the MOS transistors Q1–Q9 are connected to the clock pulse generator 11 in order to receive the appropriate clock pulses $\phi 1$–$\phi 9$ therefrom. The N-type sectors 23 are connected to a common bus 25 through openings in the silicon oxide coating. The bus 25 is connected to the input of the high input impedance buffer 12.

The arrangement as shown in FIG. 4 including the resistance network R1–R8 and the MOS switching transistors Q1–Q9 in an integrated circuit structure introduces certain errors in the resistance ratios. The nubs 22 which are the source regions for the MOS transistors do not tap the linear resistance 21 at points. The nubs 22 require both a finite length along the direction of the linear resistance 21 and also a finite width perpendicular thereto sufficient to provide each source region. Each nub 22 has a resistance related to its dimensions which causes a shunting effect on the resistances of the linear resistance 21. Under worst case conditions, this effect is the nub resistance in parallel with the diffusion resistance area consumed by the nub. Thus, the voltages present at the voltage nodes (the transistor sources) are a function of both their placement along the length of the linear resistance 21 and the dimensions of the nubs. In generating linear waveforms for which the resistance values between the voltage nodes are equal or are binary weighted, placing the centers of the nubs at the calculated tapping points for the voltage nodes minimizes errors. In generating nonlinear waveforms, however, the resistance values differ in a non-periodic manner. Apparently because of the lack of symmetry in the structure and thus the difficulty of determining tapping points accurately errors occur at the voltage nodes reducing the precision of the synthesized waveform.

Figure 5:
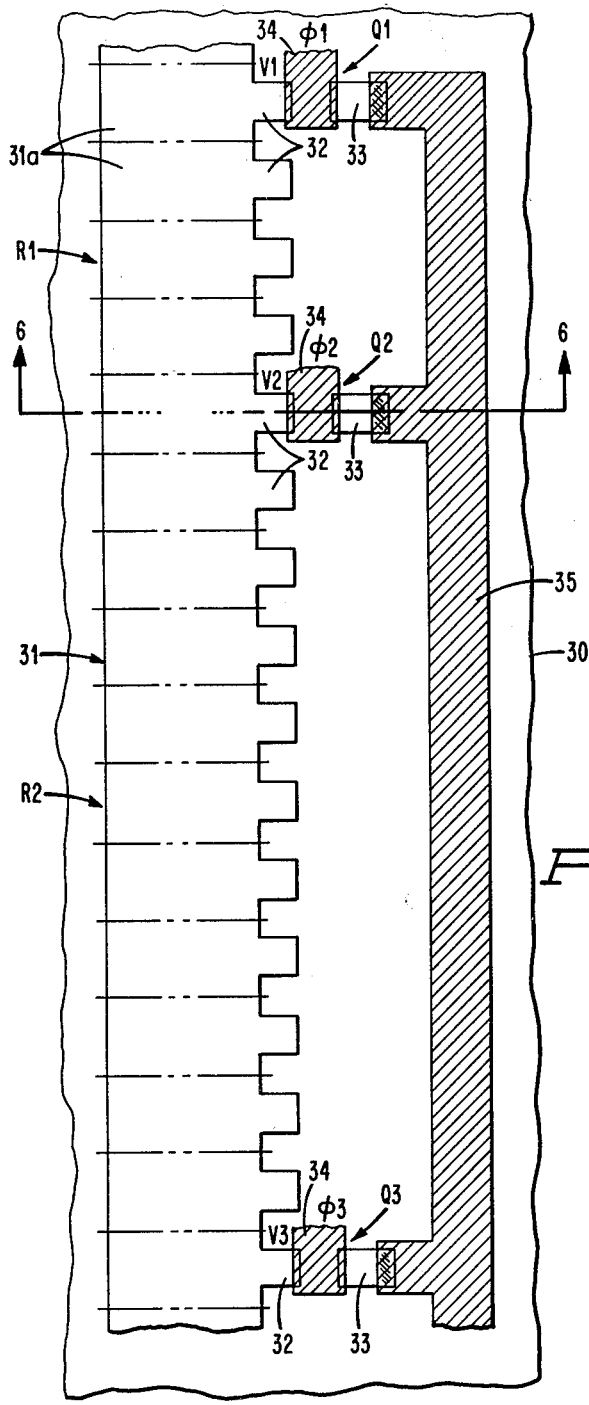
FIG. 5 is a representation of a fragment of an MOS integrated circuit structure in accordance with the present invention for use in the apparatus of FIG. 1.

It has been found that it is possible to effectively cancel the errors produced by the presence of nubs, or MOS transistor source regions, by constructing the diffused linear resistance as a plurality of contiguous unit value elements each having a nub. Transistors are employed only at the required voltage node tapping points and not at each nub. FIG. 5 illustrates this structure.

This arrangement is extremely precise provided the waveform function can be derived using integer ratios of unit value elements for the resistances between voltage nodes, and the resulting area of the semiconductor body required is tolerable. In the specific situation of synthesizing a sixteen-step sine wave the total number of equal value resistance elements required to provide integer ratios between the voltage nodes would be very large. Because of the minimum area which would be required for each nub and the spacing between nubs due to limitations of the fabrication process, the total space consumed in a semiconductor body would be unacceptable.

In order to implement a sixteen-step sine wave a ratio of resistance values is calculated to the closest integer approximation to the desired waveform with the constraints imposed by the manufacturing processes and space limitations. In addition, corrections are added based on a ratio of the nubs. It has been determined that resistance ratios of R1=R8=99 units, R2=R7=282 units, R3=R6=422 units, and R4=R5=498 units produce voltage levels at the voltage nodes V1–V9 such that an accurate sixteen-step sine wave approximation can be generated. In order for the structure to be feasible as a practical matter so that the area consumed is not exessive, the maximum number of resistance elements in the linear resistance should be about 100. Thus the number of resistance elements for each resistance was determined to be R1=R8=4, R2=R7=11, R3=R6=17, R4=R5=20. Since the ratios of the number of resistance elements in the resistances R1–R8 are not exactly the same as the ratios of the resistance values, the lengths of the resistance elements, and consequently the resistance values, are made approximately equal rather than exactly equal.

Figure 3:
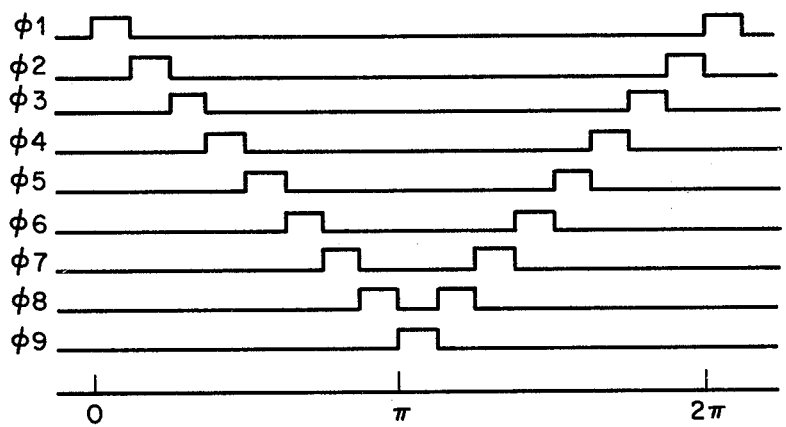
FIG. 3 illustrates the waveform of clock pulses employed in a specific embodiment of the apparatus of FIG. 1.
Figure 6:
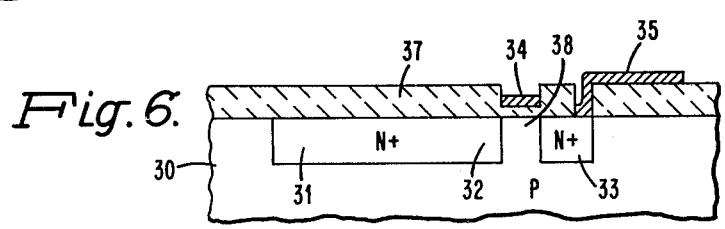
FIG. 6 is a representation of the structure of FIG. 5 taken in cross-section along line 6—6 of FIG. 5.

FIGS. 5 and 6 illustrate a fragment of a silicon body having fabricated therein monolithic integrated circuit structure in accordance with the foregoing discussion. The fragment is a P-type region 30 having a linear resistance 31 inset therein. The linear resistance 31 is a diffused N-type region having two opposed generally parallel side edges. The linear resistance 31 is considered as being divided into a plurality of contiguous approximately equal resistance elements 31a each having a nub 32 extending from one of the side edges. Certain ones of the nubs 32 positioned at the voltage nodes V1–V9 are the source regions for MOS transistors Q1–Q9. N-type diffused sectors 33 which are adjacent to but spaced from the source nub 32 are the drain regions for the MOS transistors. The portion 38 of the P-type region between each source and drain region serves as the channel region of the MOS transistor. An adherent nonconductive coating 37 as of silicon oxide overlies the surface of the silicon body. A conductive layer 34 overlies the nonconductive coating over the channel region to provide the gate electrode for the MOS transistor. The drain regions 33 are connected in common to a conductive bus 35 through openings in the oxide coating 37. The appropriate clock signals ∅1-∅9 are applied to the gate electrodes of the MOS transistors Q1-Q9 in the sequence as indicated in FIG. 3. Each pulse ∅1-∅9 switches the associated MOS transistor from the high impedance to the low impedance condition thus connecting each of the voltage nodes V1-V9 in repeated succession to the conductor 35. Conductor 35 is connected to the input of the buffer 12 (FIG. 1).

In a specific implementation the width of the linear resistance 31, exclusive of the nubs 33 was 1 mil. The dimensions of the nubs 32 were 0.3 mil along the length of the linear resistance 31 and 0.1 mil perpendicular to the linear resistance 31. Each channel region 38 was 0.3 mil by 0.3 mil. The surface resistivity of the N-type linear resistance 31 was approximately 20 ohms per square. The lengths of resistances R1-R8 between voltage nodes V1-V9 were in accordance with the unit ratios given above multiplied by a scaling factor of 0.025 mil per unit. Thus, the lengths of the resistances R1-R8 to the center of the source nub constituting the voltage nodes V1-V9 were R1=R8=2.475 mils, R2=R7=7.05 mils, R3=R6=10.55 mils, and R4=R5=12.45 mils. The appropriate number of resistance elements 31a as discussed above were fabricated between voltage nodes. Each resistance element was of approximately the same configuration and of approximately equal resistance value so as to permit precise location of the source nubs at the voltage nodes V1-V9.

Waveform generating apparatus employing integrated circuit structure in accordance with the present invention provides the advantages of integrated circuit technology for synthesizing precise, accurate waveforms. Symmetry in the series string resistance and tapping point transistor switches is provided by the resistance elements, all of which are approximately equal and all of which contain a nub equal to the source region nubs of the MOS switching transistors at the tapping point.

While there has been shown and described what is considered a preferred embodiment of the present invention, it will be obvious to those skilled in the art that various changes and modifications may be made therein without departing from the invention as defined by the appended claims.

What is claimed is:

1. Monolithic integrated circuit structure comprising
a body of semiconductor material having a region of one conductivity type;
a linear resistance of semiconductor material of the opposite conductivity type inset in said region of the one conductivity type;
said linear resistance being a series of contiguous resistance elements of approximately the same physical configuration and of approximately equal resistance value;
each resistance element including a projection of semiconductor material of the opposite conductivity type protruding into said region of the one conductivity type;
a plurality of sectors of semiconductor material of the opposite conductivity type inset in said region of the one conductivity type, the number of sectors being less than the number of resistance elements, said sectors being adjacent to but spaced from the projections of particular ones of said resistance elements; and
each sector and the projection adjacent thereto forming the drain and source regions, and the portion of the region of the one conductivity type therebetween forming the channel region of an MOS transistor;
wherein
the particular ones of said resistance elements are spaced from each other by sets of intervening resistance elements; and
the resistances of the sets of intervening resistance elements have a non-linear relationship, each of the intervening resistance elements of at least one of the sets being at least about 3 percent larger in resistance than each of the intervening resistance elements of at least another of the sets.

2. Monolithic integrated circuit structure in accordance with claim 1 including
a layer of an adherent nonconductive material overlying the portion of the region of the one conductivity type between each of said sectors of the opposite conductivity type and the projection of each of said particular ones of the resistance elements; and
a layer of conductive material overlying each of said layers of nonconductive material to provide the gate electrode of each of said MOS transistors.

3. Monolithic integrated circuit structure in accordance with claim 2 including
an electrical contact to each of said sectors of the opposite conductivity type.

4. Monolithic integrated circuit structure in accordance with claim 3 wherein
said linear resistance is an elongated diffused region having two opposed generally parallel side edges; and
each of said projections extends from one of the side edges of the linear resistance at the central portion of the one of the side edges of the resistance element.

5. Waveform generating apparatus including
monolithic integrated circuit structure in accordance with claim 3;
means for coupling a first source of potential to the linear resistance at one end thereof and for coupling a second source of potential to the linear resistance at the opposite end thereof whereby voltages of predetermined value are established at the projections of the particular ones of the resistance elements;
high input impedance buffer means having its input connected to the electrical contacts to said sectors; and
clock means coupled to the gate electrode of each of said MOS transistors for causing each of said MOS transistors to operate in a low impedance condition in a predetermined recurring sequence whereby a predetermined succession of voltages is produced at the output of the buffer means.

6. Waveform generating apparatus in accordance with claim 5 including
low pass filter means coupled to the output of said buffer means for producing a continuous, smoothed periodic waveform from the predetermined succession of voltages at the output of the buffer means.

* * * * *